United States Patent [19]

Ueno

[11] Patent Number: 5,773,859
[45] Date of Patent: Jun. 30, 1998

[54] SOLID-STATE IMAGE TRANSISTOR HAVING A SHIELDING FILM

[75] Inventor: Takahisa Ueno, Kanagawa, Japan

[73] Assignee: Sony Corporation, Tokyo, Japan

[21] Appl. No.: 755,244

[22] Filed: Nov. 22, 1996

Related U.S. Application Data

[63] Continuation of Ser. No. 313,367, Sep. 27, 1994, abandoned.

[30] Foreign Application Priority Data

Sep. 28, 1993 [JP] Japan ................................... 5-241183

[51] Int. Cl.$^6$ ........................ H01L 31/062; H01L 31/113
[52] U.S. Cl. .......................... 257/294; 257/297; 257/401; 257/435; 257/448
[58] Field of Search ................................... 257/294, 230, 257/231, 435, 445, 448, 763, 290, 291, 401

[56] References Cited

U.S. PATENT DOCUMENTS

| 4,616,401 | 10/1986 | Takeuchi ................................. 257/763 |
| 4,901,129 | 2/1990 | Hynecek . |
| 4,949,152 | 8/1990 | Asano et al. ............................. 257/294 |
| 4,994,893 | 2/1991 | Ozaki et al. ............................. 257/763 |

FOREIGN PATENT DOCUMENTS

| 0 038697A1 | 10/1981 | European Pat. Off. . |
| 0 118568A1 | 9/1984 | European Pat. Off. . |
| 0 444 963 | 9/1991 | European Pat. Off. ............... 257/435 |
| 3407038A1 | 8/1984 | Germany . |
| 4-24964 | 1/1992 | Japan ..................................... 257/448 |

OTHER PUBLICATIONS

Koike et al., "Solid–State Imaging and Biomedical Applications", *ISSCC*, Feb. 1979, pp. 192–193.
IEEE Electron Device Letters, vol. 11, No. 4, Apr. 1990, New York USA, pp. 143–145, Nishizawa et al. "Spectral Response of an SIT Image Sensor with an Improved Structure".
Patents Abstracts of Japan, vol. 17, No. 145 (E1337), 24 Mar. 1993, and JP–A–04 312 082 (Sony Corp.).

*Primary Examiner*—Ngân V. Ngô
*Attorney, Agent, or Firm*—Hill & Simpson

[57] ABSTRACT

A solid-state image device and a method of manufacturing are disclosed. The solid-state image device has: a plurality of pixels, each pixel having a transistor for converting an incident light into an electrical signal, the transistor having a semiconductor substrate, source-drain regions formed on a surface portion of the semiconductor substrate, the source-drain regions being spaced apart from each other to define a channel region between them, and a gate electrode formed above the channel region; a selection line electrically connected to the gate electrode for selecting a pixel from the plurality of pixels; an interlayer insulating film formed to cover the gate electrode and the source and drain regions; a signal line connected to one of the source-drain regions through a contact hole formed in the interlayer insulating film; and a light-shielding film formed below the interlayer insulating film to cover the source-drain region connected to the signal line.

12 Claims, 12 Drawing Sheets

SOLID-STATE IMAGE TRANSISTOR HAVING A SHIELDING FILM

This is a continuation of application Ser. No. 08/313,367, filed Sep. 27, 1994 now abandoned.

BACKGROUND OF THE INVENTION

1. Field of the Invention

This invention relates to a solid-state image device and a method of manufacturing, and, more particularly to an amplification solid-state image device having transistors for photoelectric transfer arrayed for each of the pixels, with the transistors having selection lines connected to their respective gate electrodes and having signal lines connected to their respective source-drain regions.

2. Description of Related Art

A conventional amplification solid-state image device has a plurality of MOS transistors Tr for photoelectric transfer corresponding to pixels arrayed in a matrix, as shown in FIG. 1. These transistors Tr have their respective gate electrode connected to a horizontal selection line Lh extending in rows from a horizontal shift register HR. The transistors Tr also have their respective source regions connected to a vertical signal line Ls extending in the direction of column and their respective drain regions connected to power sources having a power source voltage Vdd.

In each of the transistors Tr, incidence of light generates an electron-hole pair in response to the amount of incident light. Of the electron-hole pair thus formed, the electron flows into a channel region while the hole advances into a depleted substrate surface. Thus, the threshold value of the transistor changes.

Consequently, when one horizontal selection line Lh of the horizontal selection lines Lh extending in rows from the horizontal shift register HR connected to peripheral circuits has a high potential level, signal currents corresponding to the threshold value appear on the corresponding parts of the vertical signal line Ls, so as to be outputted as image signals of selected rows, as disclosed in the U.S. Pat. No. 4,901,129, "Bulk Charge Modulated Transistor Threshold Image Sensor Elements and Method of Making."

In the conventional amplification solid-state image device, however, one of the transistors Tr forming the pixels has a cross section in which the vertical signal line Ls composed of an Al interconnecting layer is only connected to a source region 101 formed in an N-type impurity diffused region through a contact hole 104 formed in a transparent interlayer insulating film 103 on a gate electrode 102, as shown in FIG. 2.

The Al interconnecting layer Ls, which serves to shield light, may have a width smaller than that of the formation area for the underlying source region 101. In this case, it is often the case that light of normal incidence permeates the transparent interlayer insulating film 103 so as to be incident on the source region 101.

In particular, when the light is incident on the source region 101 of the transistor Tr relating to a pixel not selected by the horizontal shift register HR, photoelectric transfer is carried out by a photodiode formed by P-N junction between the N-type source region 101 and a P-type silicon substrate or well substrate 105, and a false signal due to a charge formed by the photoelectric transfer from the non-selected source region 101 appears as a noise on the vertical signal line Ls.

In this amplification solid-state image device, since the single vertical signal line Ls in the direction of column is employed, the noise appears as a longitudinal streak such as smear of the CCD solid-state image device (so-called CCD image sensor) when an object of high luminance is imaged. This noise is generally referred to as a blooming phenomenon, which causes deterioration in picture quality.

To avoid the blooming phenomenon, it is conceivable to broaden a light-shielding area composed of the Al interconnecting layer Ls by increasing the width of the Al interconnecting layer Ls. However, the interlayer insulating film 103 below the Al interconnecting layer Ls is formed with a thickness of several hundred nm for flattening the surface of the device. Therefore, though the light of normal incidence can be shielded, slantingly incident light and reflected light cannot be shielded. The deterioration in picture quality due to the blooming phenomenon thus cannot be avoided with these devices.

OBJECT AND SUMMARY OF THE INVENTION

It is therefore an object of the present invention to provide a solid-state image device which is capable of effectively shielding the incident light onto the source-drain region of the transistor for the non-selected pixel, to prevent the generation of a false signal from the non-selected pixel and for reducing deterioration in picture quality due to the noise of the so-called blooming phenomenon.

It is another object of the present invention to provide a method of manufacturing a solid-state image device whereby it is possible to easily manufacture a solid-state image device capable of effectively shielding the incident light onto the source-drain region of the transistor for the non-selected pixel, for preventing generation of a false signal from the non-selected pixel and for reducing deterioration in picture quality due to the noise of the so-called blooming phenomenon.

According to the present invention, there is provided a solid-state image device having: a plurality of pixels, each pixel having a transistor for converting incident light into an electrical signal, the transistor having a semiconductor substrate, source-drain regions formed on a surface portion of the semiconductor substrate, the source-drain regions being spaced apart from each other to define a channel region between them, and a gate electrode formed above the channel region; a selection line electrically connected to the gate electrode for selecting a pixel from the plurality of pixels; an interlayer insulating film formed to cover the gate electrode and the source drain regions; a signal line connected to one of the source-drain regions through a contact hole formed in the interlayer insulating film; and a light-shielding film formed below the interlayer insulating film to cover the source-drain region connected to the signal line.

The light-shielding film is composed of a refractory metal. The gate electrode is formed in an annular shape. The plural pixels are formed in a matrix.

According to the present invention, there is provided a method of manufacturing a solid-state image device having the steps of: forming a transistor for photoelectric transfer on a semiconductor substrate, the transistor having source-drain regions formed on a surface portion of the semiconductor substrate, the source-drain regions being spaced apart from each other to define a channel region between them, and a gate electrode formed above the channel region; forming a light-shielding film via an insulating film on the gate electrode; patterning the light-shielding film to leave the same on one of the source-drain regions; forming an interlayer insulating film on an entire surface of the substrate; forming a contact hole in the interlayer insulating film, the contact hole extending to reach the one source-drain region; and forming a signal line on the interlayer insulating film, the signal line being connected to the one source-drain region through the contact hole.

The light-shielding film is composed of a refractory metal. The gate electrode is formed in an annular shape.

In the solid-state image device according to the present invention, incidence of light to the transistors for photoelectric transfer arrayed in accordance with pixels causes a threshold value of the transistor to change in response to the amount of incident light. Then, an image signal corresponding to the threshold value is taken out through the selection line for selecting rows or columns from the transistor relating to the rows or columns.

Since the one source-drain region connected to the signal line is covered with the light-shielding film formed below the interlayer insulating film, slantingly incident light and reflected light are shielded and prevented from entering the source-drain region by the light-shielding film.

Consequently, even when a transistor not selected is irradiated with a light, the light is prevented from being incident on the source-drain region, so that output of a false signal from the non-selected transistor can be avoided. Thus, the blooming phenomenon of the solid-state image device due to superposition of false signals can be reduced, and deterioration in picture quality can be restricted. Particularly, by using a refractory metal for the light-shield film, the light-shielding film can be formed simultaneously with interconnecting formation for low resistance. Thus, manufacturing processes can be simplified.

In the method of manufacturing a solid-state image device according to the present invention, the light-shielding film is first formed via the insulating film on the gate electrode of the transistor for photoelectric transfer, and is then selectively patterned to be left on the one source-drain region. After the interlayer insulating film is formed on the entire surface, the contact hole extending to reach the one source-drain region is formed in the interlayer insulating film. Then, the signal line connected to the one source-drain region through the contact hole is formed on the interlayer insulating film.

Since the light-shielding film formed via the insulating film on the gate electrode is selectively patterned to be left on the one source-drain region connected to the signal line, the one source-drain region connected to the signal line is capable of easily producing pixels covered with the light-shielding film formed below the interlayer insulating film.

In the solid-state image device thus produced by the above method of manufacturing, the normally incident light, the slantingly incident light and the reflected light are shielded and prevented from entering the source-drain region by the light-shielding film.

Consequently, even when transistor not selected is irradiated with a light, the light is prevented from being incident on the source-drain region, so that output of a false signal from the non-selected transistor can be avoided. Thus, the blooming phenomenon of the solid-state image device due to superposition of false signals can be reduced, and deterioration in picture quality can be restricted.

Particularly, by using a refractory metal for the light-shield film, the light-shielding film can be formed simultaneously with interconnecting formation for low resistance. Thus, manufacturing processes can be simplified.

BRIEF DESCRIPTION OF THE DRAWINGS

FIG. 6A shows a state in which a filling channel region is formed in the surface of a P$^-$-type well region. FIG. 6B shows a state in which a gate electrode is formed via a gate insulating film on the P$^-$-type well region. FIG. 6C shows a state in which an oxide film is formed on the gate electrode.

FIG. 7A shows a state in which a thin oxide film and a thin refractory metal film are formed on a stacked film composed of the gate electrode and the oxide film, with a thick oxide film being then formed on the entire surface. FIG. 7B shows a state in which etching back is carried out on the entire surface so as to leave the oxide film on the source region. FIG. 7C shows a state in which the refractory metal film is selectively removed by etching so as to be left on the source region.

FIG. 8A shows a state in which an oxide film is formed for flattening the entire surface, with the oxide film then having a contact hole formed therein. FIG. 8B shows a state in which a vertical signal line composed of an Al interconnecting layer is formed.

FIGS. 10 to 10C are views showing processes of a first modification of the method of manufacturing a solid-state image device of the embodiment. FIG. 10C shows a state of the last stage in which a vertical signal line is formed.

FIG. 11A shows a state in which an adhesion layer is formed on a stacked film composed of a gate electrode and an oxide film, with a tungsten layer being then formed on the entire surface. FIG. 11B shows a state in which etching back is carried out on the entire surface so as to leave the tungsten layer on a source region and a drain region. FIG. 11C shows a state of the last stage in which a vertical signal line is formed.

FIG. 12A shows a state in which a sidewall is formed on a stacked film composed of a gate electrode and an oxide film. FIG. 12B shows a state in which a tungsten layer is selectively grown on a source region and a drain region by a selective growth CVD method. FIG. 12C shows a state of the last stage in which a vertical signal line is formed.

FIG. 13A shows a state in which a refractory metal film is formed via an oxide film on a stacked film composed of a gate electrode and an oxide film, with a photoresist film being then formed on the entire surface. FIG. 13B shows a state in which an opening is formed in a portion corresponding to the gate electrode of the photoresist film. FIG. 13C shows a state of the last stage in which a vertical signal line is formed.

DETAILED DESCRIPTION OF THE PREFERRED EMBODIMENTS

Preferred embodiments of a solid-state image device according to the present invention applied to an amplification solid-state image device having MOS transistors corresponding to pixels, hereinafter referred to as the amplification solid-state image device of the embodiment, will now be described with reference to FIGS. 3 to 13A–13D.

Figure 1:
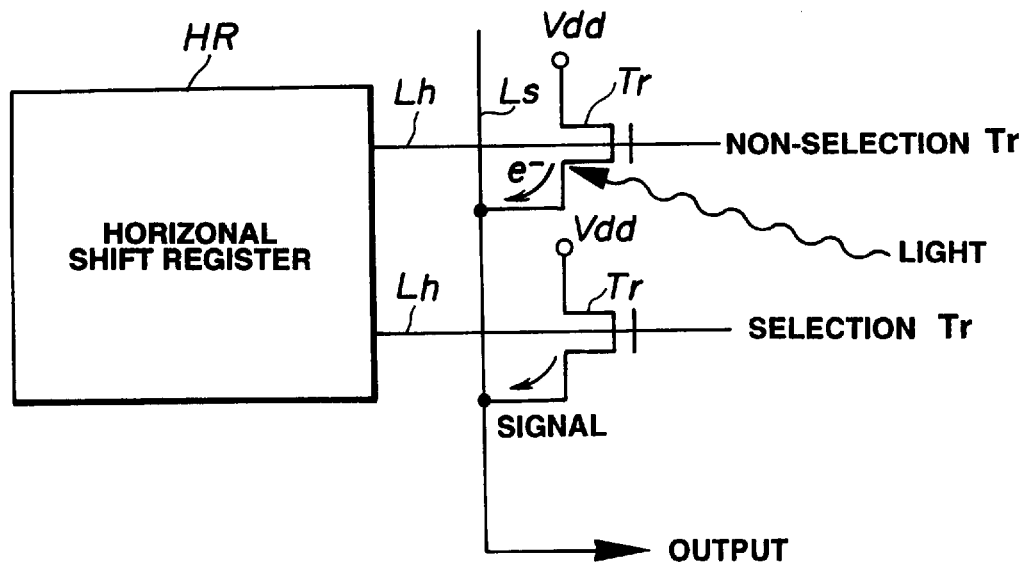
FIG. 1 is an equivalent circuit diagram showing the general structure of an amplification solid-state image device.
Figure 2:
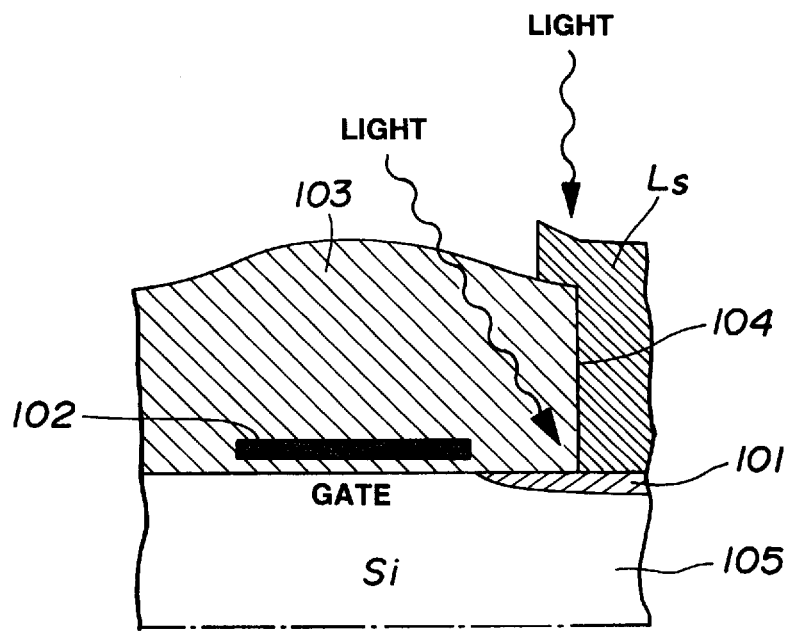
FIG. 2 is a cross-sectional view showing the structure of each pixel of the conventional amplification solid-state image device.
Figure 3:
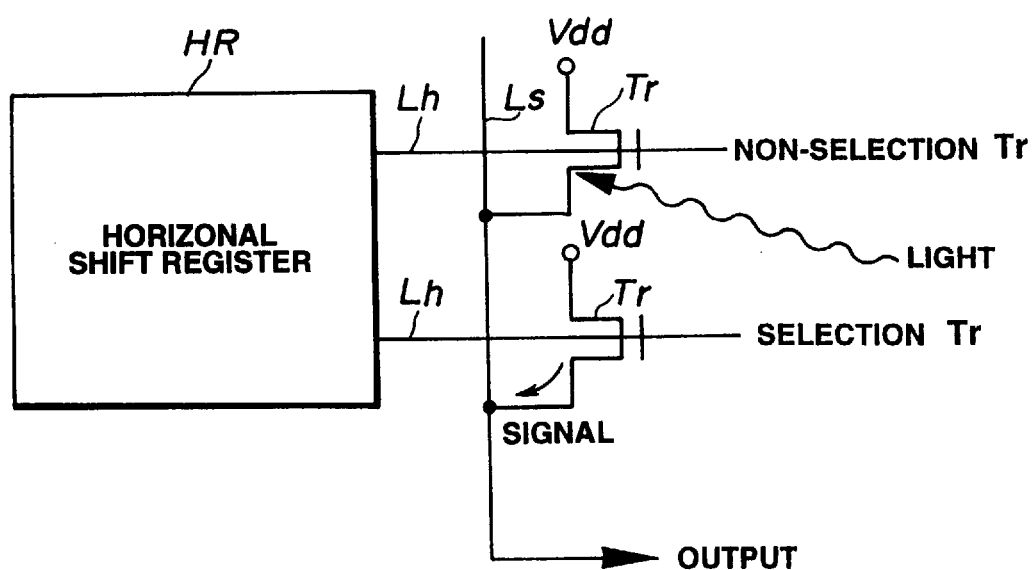
FIG. 3 is an equivalent circuit diagram showing an embodiment of a solid-state image device of the present invention, hereinafter referred to as the amplification solid-state image device of the embodiment, applied to an amplification solid-state image device having MOS transistors corresponding to pixels.

The amplification solid-state image device of the embodiment has plural MOS transistors Tr for photoelectric transfer arrayed in a matrix, as shown in FIG. 3. These transistors Tr have their respective gate electrode connected to a horizontal selection line Lh extending in rows from a horizontal shift register HR. The transistors Tr also have their respective sources connected to a vertical signal line Ls extending in the direction of column and have their drains connected to power sources having a power source voltage Vdd.

Figure 4:
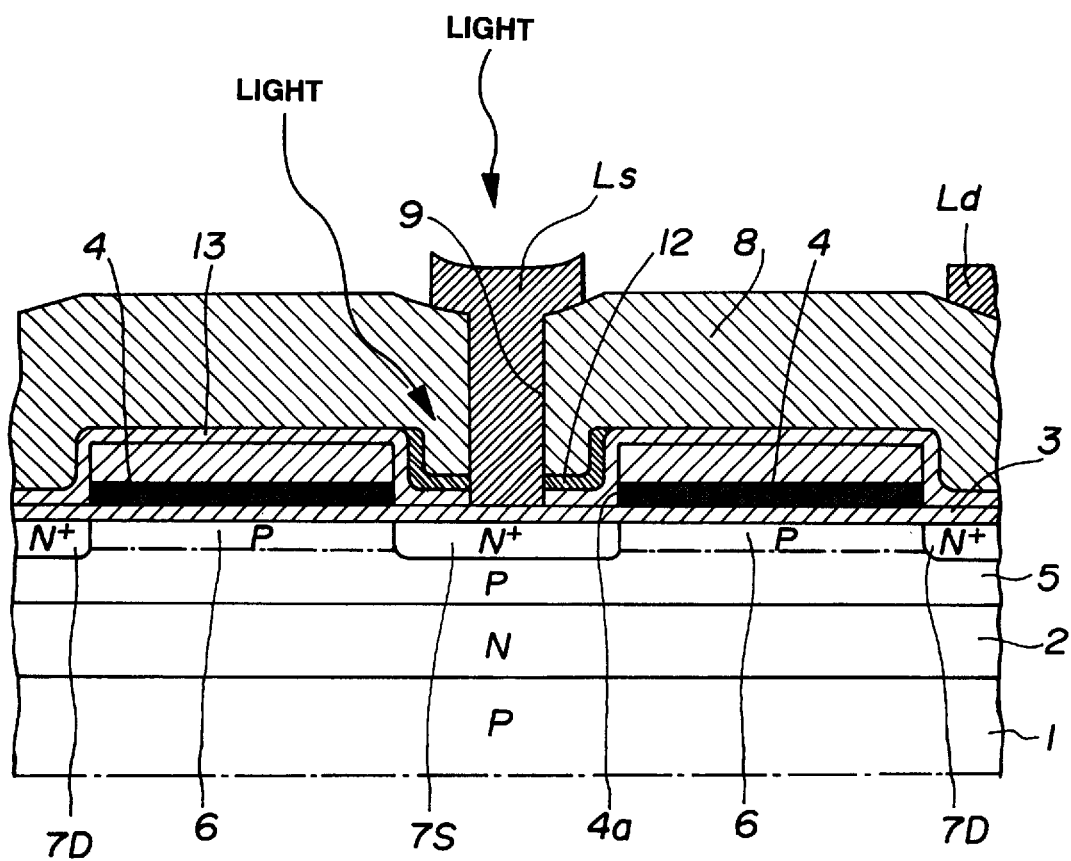
FIG. 4 is a cross-sectional view showing the structure of each pixel of the amplification solid-state image device of the embodiment.

Each pixel has an N-type well region 2 and a P$^-$-type well region 5 sequentially formed on a P-type silicon substrate, and has a gate electrode 4 composed of a transparent polycrystalline silicon layer formed via a gate insulating film 3 composed of SiO$_2$ on the well region 2, as shown in FIG. 4. The gate electrode 4 has an annular portion 4b formed substantially at the center of a center hole 4a having a diameter of approximately 1 μm or less, and a protruded portion 4c partly protruded from the annular portion 4b, as shown in FIG. 5.

A P-type filling channel region 6 is formed below the gate electrode 4. An N-type source region of 7S of high density is formed below the center hole 4a in the gate electrode 4, and an N-type drain region 7D of high density is formed in a region other than the portion corresponding to gate electrode 4, as shown in FIG. 4. A thick interlayer insulating film 8 is formed on the gate electrode 4. The interlayer insulating film 8 has a contact hole 9 at a position corresponding to the center hole 4a of the gate electrode 4, with a diameter smaller than that of the center hole 4a.

Figure 5:
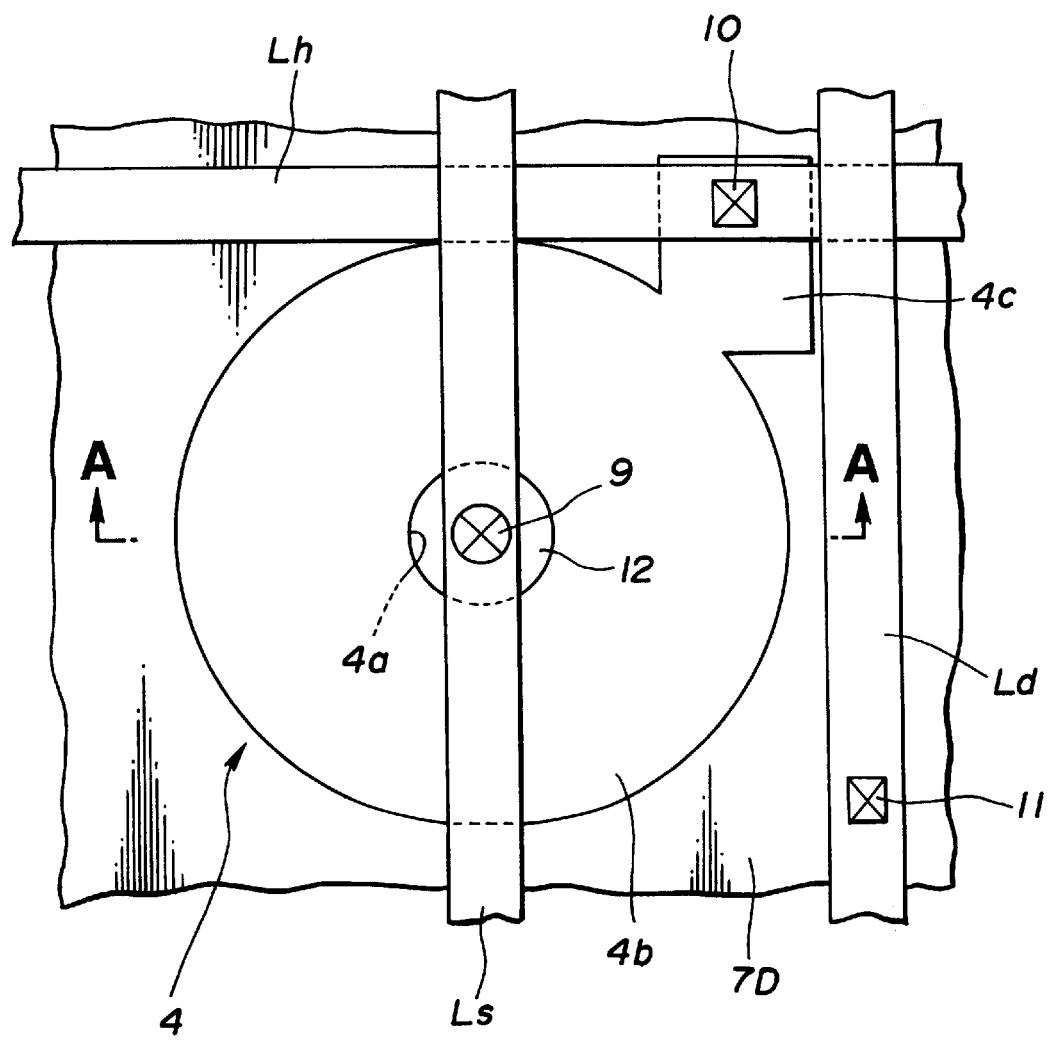
FIG. 5 is a plan view showing the structure of each pixel of the amplification solid-state image device of the embodiment.

The gate electrode 4 is connected to the horizontal selection line Lh composed of an Al interconnecting layer via a contact hole 10 in the protruded portion 4c, as shown in FIG. 5, with the source region 7S shown in FIG. 4 being connected to the vertical signal line Ls composed of an Al interconnecting layer via the contact hole 9 and with the drain region 7D being connected a power source supply line Ld composed of an Al interconnecting layer via a contact hole 11. Thus, the transistor Tr for photoelectric transfer shown in FIG. 3 is formed.

In each of the transistor Tr, incidence of light generates electron-hole pairs in response to the amount of incident light. Of the electron-hole pairs, the electron flows into the P-type filling channel region 6 to be led through the drain region 7D to the power source, while the hole is stored in the P$^-$-type well region 5. The storage of the hole in the P$^-$-type well region 5 increases a positive space potential, thus changing a threshold value of the transistor Tr. That is, the threshold value of the transistor Tr is modulated in response to the amount of incident light.

When one of the horizontal selection lines Lh extending in rows from the horizontal shift register HR connected to peripheral circuits has a high potential level, a signal current corresponding to the threshold value appears on the corresponding vertical signal line Ls, so as to be outputted as an image signal of a selected row.

The amplification solid-state image device of the present embodiment has a light-shielding film 12 formed below the interlayer insulating film 8, particularly in a position corresponding to the center hole 4a of the gate electrode 4, for covering the source region 7S. An insulating film 13 thinner than the interlayer insulating film 8 is formed on the gate electrode 4, and the light-shielding film 12 of flat circular shape is formed over an area from the position corresponding to the inner circle edge of the center hole 4a of the gate electrode 4 to the vertical signal line Ls composed of an Al interconnecting layer on the insulating film 13. In this case, the distance from the surface of the source region 7S (that is, the surface of the silicon substrate 1) to the lower surface of the light-shielding film 12 is tens of nm. In the present embodiment, a refractory metal film, such as a tungsten (W) film, a molybdenum (Mo) film or a titanium (Ti) film, utilized as an interconnecting layer for low resistance is used as the light-shielding film 12.

In the amplification solid-state image device of the present embodiment, the source region 7S connected to the vertical signal line Ls, of the source region 7S and the drain region 7D forming the transistor Tr, is covered with the light-shielding film 12 formed below the interlayer insulating film 8. Therefore, normally incident light, slantingly incident light and reflected light are shielded and prevented from being incident on the source region 7S by the light-shielding film 12.

Consequently, even when a transistor Tr not selected is irradiated with the light, the light is not incident on the source region 7S, and output of a false signal from the non-selected transistor Tr is avoided. Thus, the blooming phenomenon of the amplification solid-state image device due to superposition of the false signal is reduced, so that deterioration in picture quality can be restricted.

Particularly, in the present embodiment, since the refractory metal film is used as the light-shielding film 12, the light-shielding film 12 can be formed simultaneously with interconnecting formation for low resistance. Thus, manufacturing processes can be simplified.

A method of manufacturing the amplification solid-state image device of the above embodiment will now be described with reference to FIGS. 6A–6C to 8A–8B, in which portions corresponding to those in FIG. 4 are denoted by the same reference numerals.

Figure 6A:
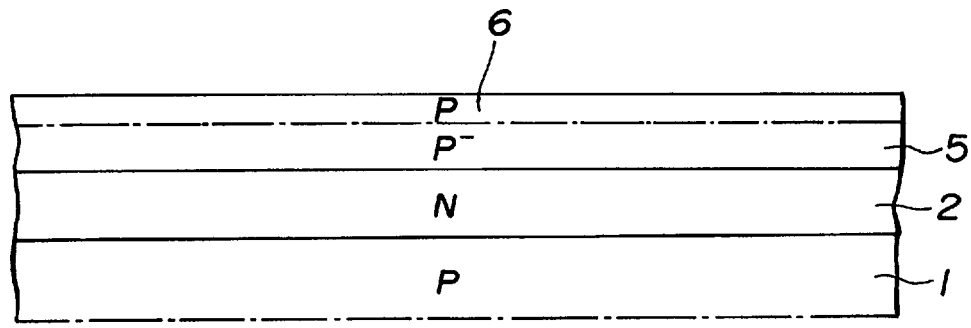
FIGS. 6A to 6C are views showing processes of a method of manufacturing a solid-state image device of an embodiment.

First, an N-type well region 2 and a P$^-$-type well region 5 are sequentially formed on a P-type silicon substrate 1, and then a P-type impurity such as boron (B) is introduced onto the surface of the P$^-$-type well region 5 by ion implantation so as to form a P-type channel region 6, as shown in FIG. 6A.

Figure 6B:
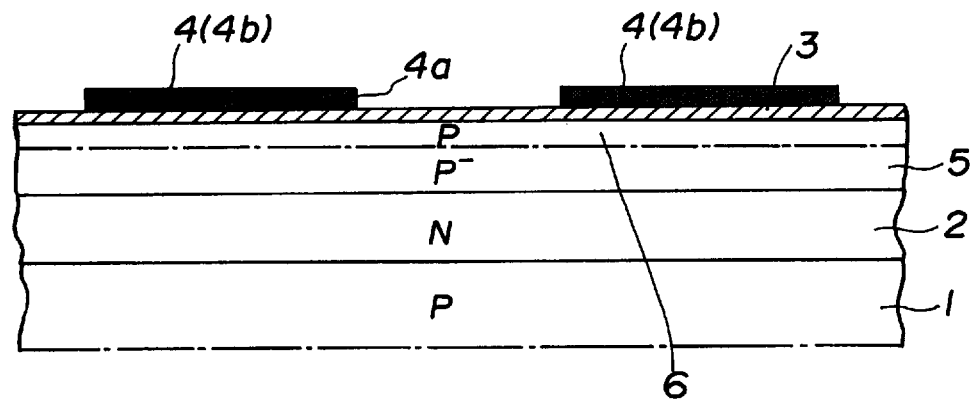

A thermal oxide film 3 as a gate insulating film composed of SiO$_2$ is formed on the entire surface of the substrate by heat treatment in an $O_2$ gas atmosphere, as shown in FIG. 6B. Then, a thin polycrystalline silicon layer is formed on the entire surface of the substrate, and is patterned to form a gate electrode 4 having an annular portion 4b having a center hole 4a with a diameter of approximately 1 μm and a protruded portion 4c partly protruded from the circular portion 4b, as shown in FIG. 5.

Figure 6C:
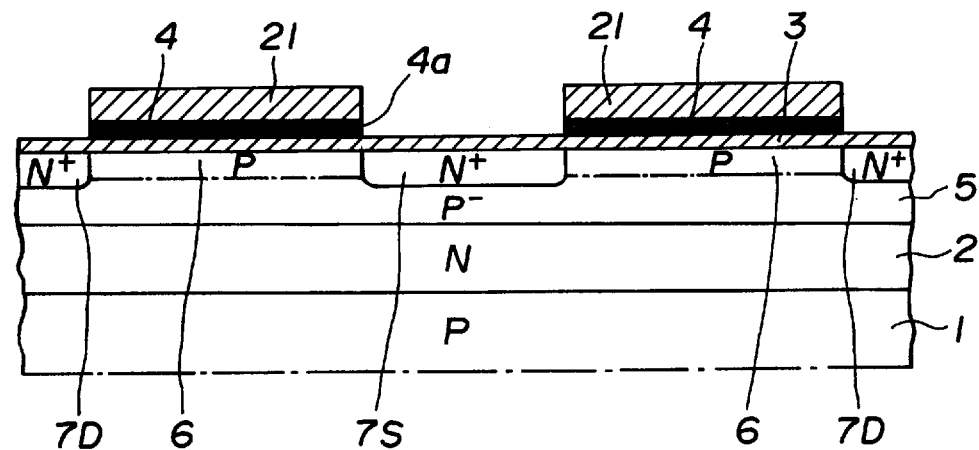

An oxide film composed of $SiO_2$ or the like with a thickness of approximately 200 nm is formed on the entire surface by the CVD method, and is patterned to be left on the gate electrode 4, as shown in FIG. 6C. That is, the oxide film 21 with a thickness of approximately 200 nm is stacked on the gate electrode 4. Then, with the oxide film 21 as a mask, an N-type impurity such as phosphorus is introduced onto the surface of an epitaxial layer 2 by ion implantation, so as to form an N-type source region 7S below the center hole 4a of the gate electrode 4 and an N-type drain region 7D in the periphery of the gate electrode 4 simultaneously.

Figure 7A:
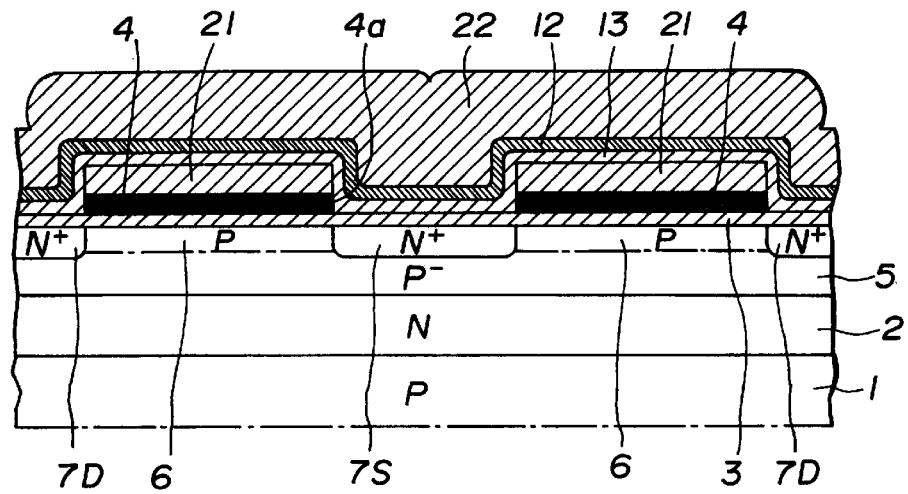
FIGS. 7A to 7C are views showing processes of the method of manufacturing a solid-state image device of the embodiment.

After an oxide film 13 composed of $SiO_2$ with a thickness of approximately tens of nm is formed on the entire surface of the substrate by the CVD method, a refractory metal film 12 composed of tungsten (W), molybdenum (Mo) or titanium (Ti) with a thickness of approximately tens of nm is formed on the entire surface by the CVD method or a sputtering method, as shown in FIG. 7A. Then, an oxide film 22 composed of $SiO_2$ is deposited thickly on the entire surface by the CVD method, particularly to fill the portion corresponding to the center hole 4a of the gate electrode 4.

Figure 7B:
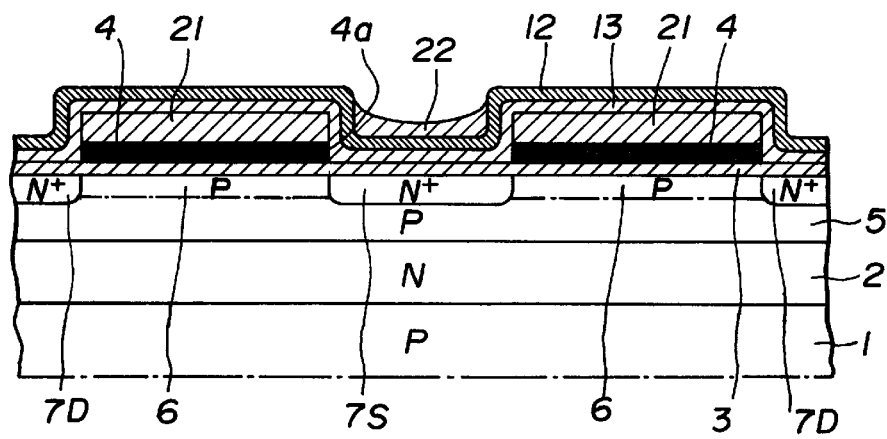

The oxide film 22 on the entire surface is then etched back by reactive ion etching (RIE) to remove the oxide film 22 by etching until the underlying refractory metal film 12 is exposed, as shown in FIG. 7B. Through this etching back, the oxide film 22 remains in the portion corresponding to the center hole 4a of the gate electrode 4 in the refractory metal film 12.

Figure 7C:
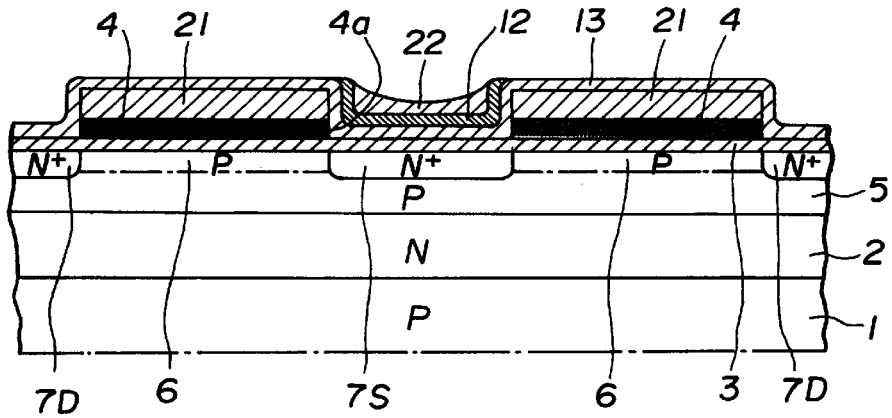

With the remaining oxide film 22 as a mask, the exposed refractory metal film 12 is removed by etching, as shown in FIG. 7C. At this point, only the refractory metal film 12 below the oxide film 22 remains to form a light-shielding film to cover the underlying source region 7S.

If the oxide film 22 is not filled sufficiently in the portion corresponding to the center hole 4a of the gate electrode 4 in deposition of the oxide film 22 as shown in FIG. 7A, the underlying refractory metal film 12 in this portion is exposed by the etching back as shown in FIG. 7B. In this case, the refractory metal film 12 in this portion is also removed by etching when other portions of the refractory metal film 12 are removed by selective etching. However, if the size of the exposed portion of the refractory metal film 12 is within a range up to the diameter of a contact hole 9 as formed later, the exposed portion is removed when the contact hole 9 is formed. Then, as the light is shielded by a vertical signal line Ls composed of an Al interconnecting layer filled in the contact hole 9, the absence of the refractory metal film 12 in this portion does not have adverse effects.

Figure 8A:
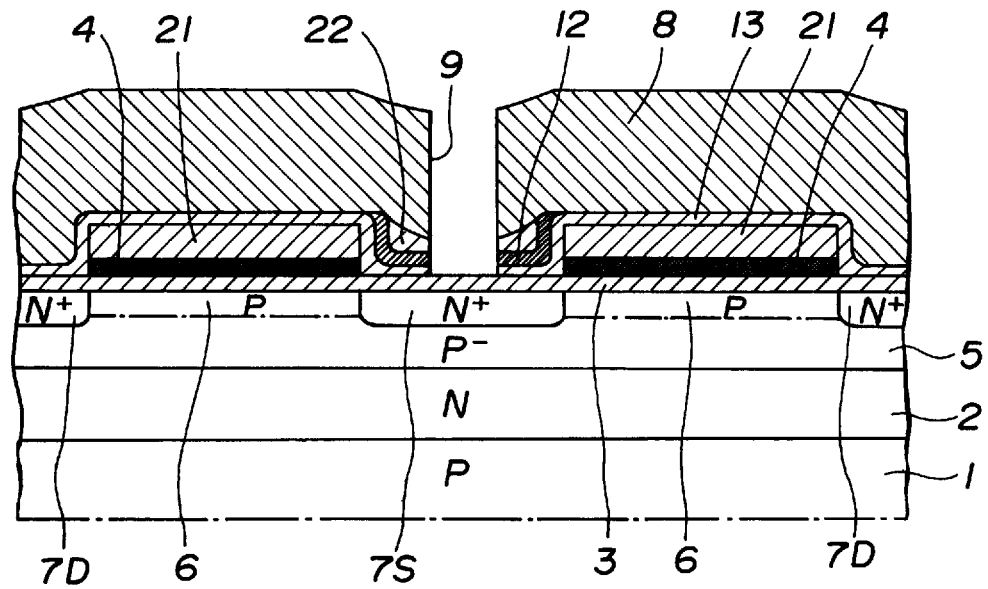
FIGS. 8A and 8B are views showing processes of the method of manufacturing a solid-state image device of the embodiment.

After a relatively thick interlayer insulating film 8 composed of $SiO_2$ or the like for flattening is formed on the entire surface of the substrate by the CVD method, the contact hole 9 extending to reach the underlying source region 7S is formed in the portion corresponding to the center hole 4a of the gate electrode 4 in the insulating film 8, as shown in FIG. 8A.

Figure 8B:
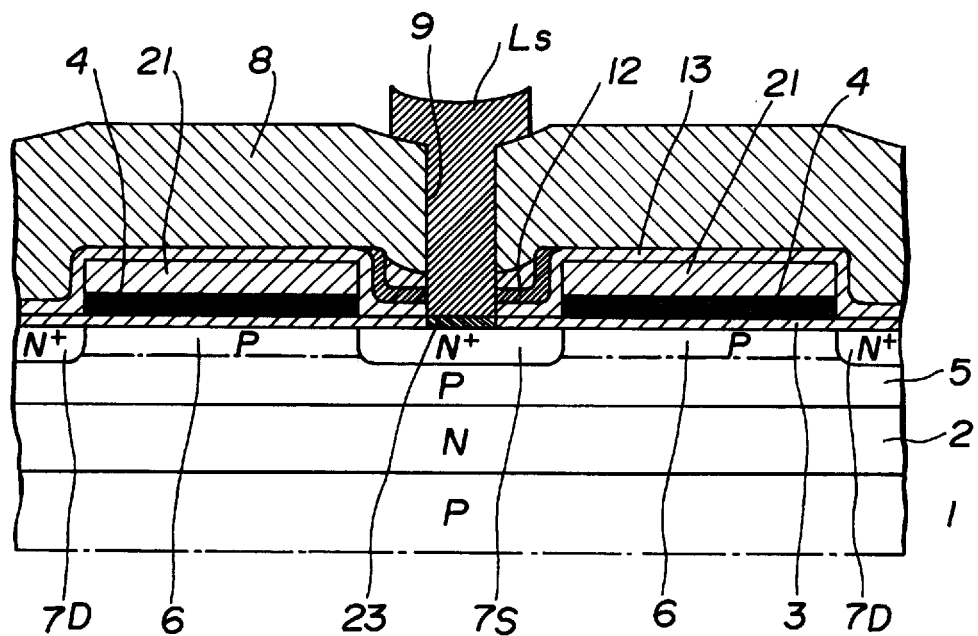

Then, a barrier metal layer 23 is formed on the entire surface, and is patterned to be left in the contact hole 9, as shown in FIG. 8B. An Al interconnecting layer is formed on the entire surface to fill the contact hole 9, and is patterned to form a vertical signal line Ls. Thus, the amplification solid-state image device of the present embodiment is produced.

Thus, in the method of manufacturing the solid-state image device of the present embodiment, the refractory metal film 12 is formed via the oxide films 21 and 13 on the gate electrode 4, and is selectively patterned to leave the light-shielding film composed of the refractory metal film 12 on the source region 7S connected to the vertical signal line Ls. Therefore, the source region 7S connected to the vertical signal line Ls, of the source region 7S and the drain region 7D forming the transistor Tr for photoelectric transfer, can easily produce pixels covered with the light-shielding film 12 formed below the interlayer insulating film 8.

In the solid-state image device produced by this manufacturing method, the normally incident light, the slantingly incident light and the reflected light are shielded and prevented from being incident on the source region 7S by the light-shielding film 12.

Consequently, even when the non-selected transistor Tr is irradiated with the light, the light is not incident on the source region 7S so as to avoid output of the false signal from the non-selected transistor Tr. Thus, the blooming phenomenon of the solid-state image device due to superposition of the false signal is reduced, so that the deterioration in picture quality can be restricted.

Figure 9:
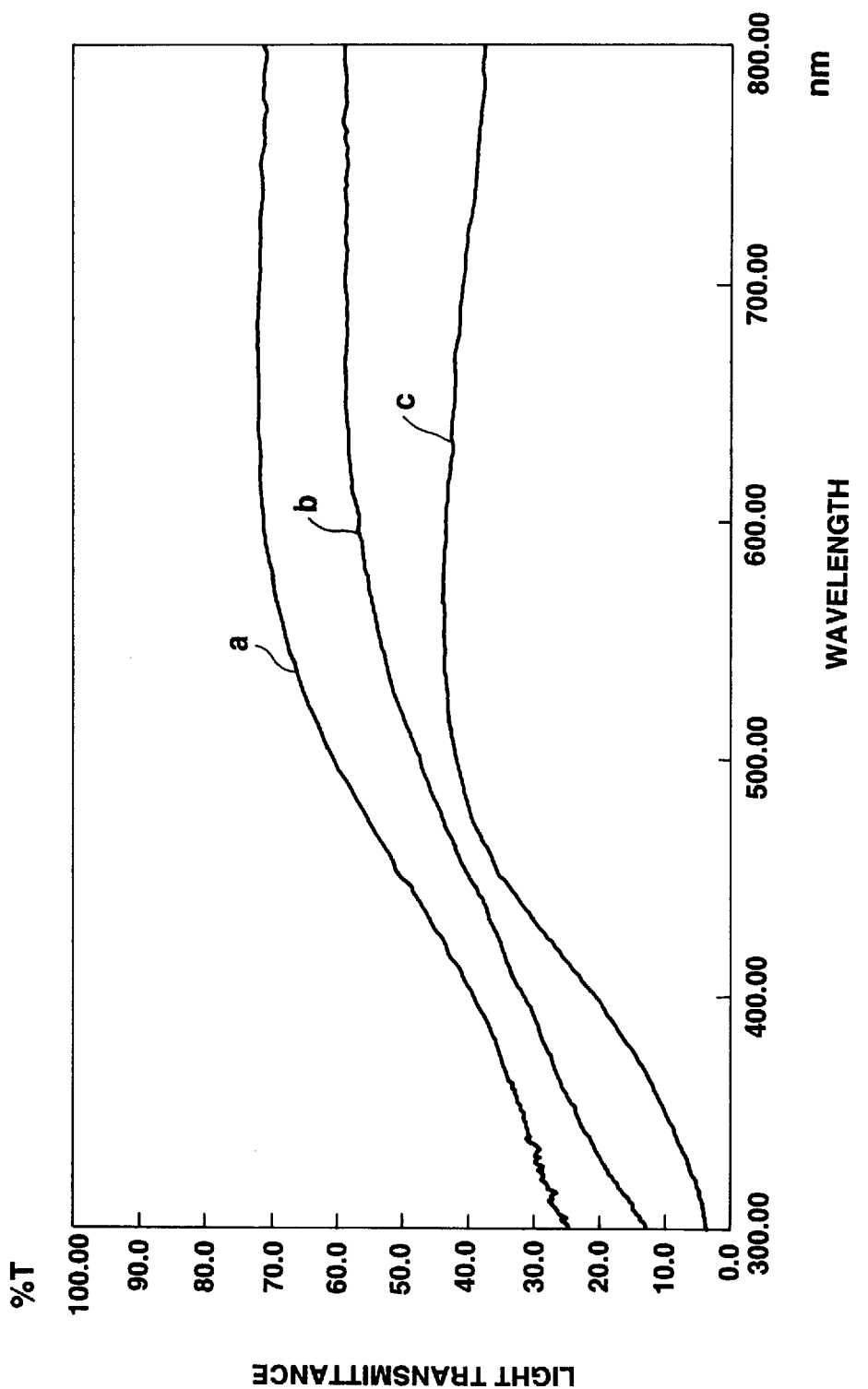
FIG. 9 is a graph showing changes in light transmittance due to differences in thickness of the refractory metal film used as the light-shielding film in the amplification solid-state image device of the embodiment.

Particularly, since the refractory metal film is used as the light-shielding film 12, the light-shielding film 12 can be formed simultaneously with interconnecting formation for low resistance. Therefore, manufacturing processes can be simplified. As seen from the graph of FIG. 9, when a refractory metal film is formed with a thickness of tens of nm as the light-shielding film 12, the refractory metal film shows a light transmittance of approximately 50% in a visible light region. Thus, the blooming can be reduced by 6 dB or more. The graph of FIG. 9 shows differences in light transmittance of the refractory metal films 12 of three different thicknesses, with curves a, b and c showing the light transmittance with thicknesses of 20 nm, 40 nm and 60 nm, respectively.

Several modifications of the method of manufacturing the solid-state image device of the above embodiment will now be described.

Figure 10A:
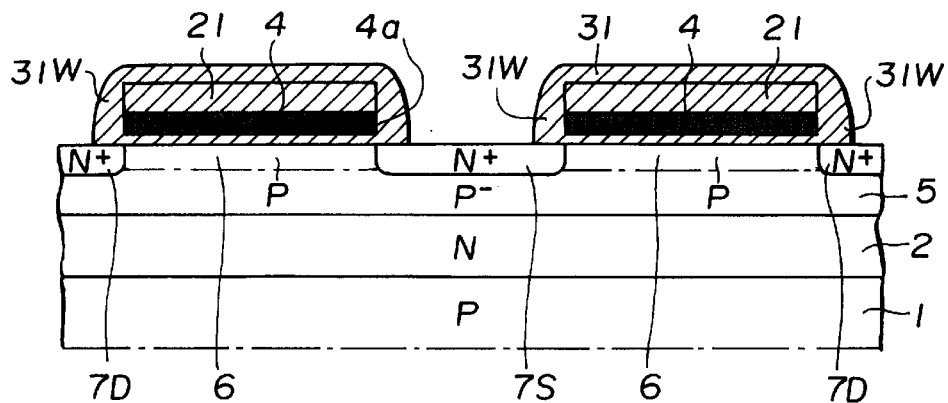
FIG. 10A shows a state in which a sidewall is formed on a stacked film composed of a gate electrode and an oxide film.

In the first modification, after the process shown in FIG. 6C, a relatively thick oxide film 31 composed of $SiO_2$ is formed on the entire surface by the CVD method, and is etched back to form a sidewall 31w composed of the oxide film 31 on the stacked film composed of the gate electrode 4 and the upper oxide film 21, as shown in FIG. 10A. In this case, the etching back is carried out until a silicon surface in the source region 7S and the drain region 7D is exposed.

Figure 10B:
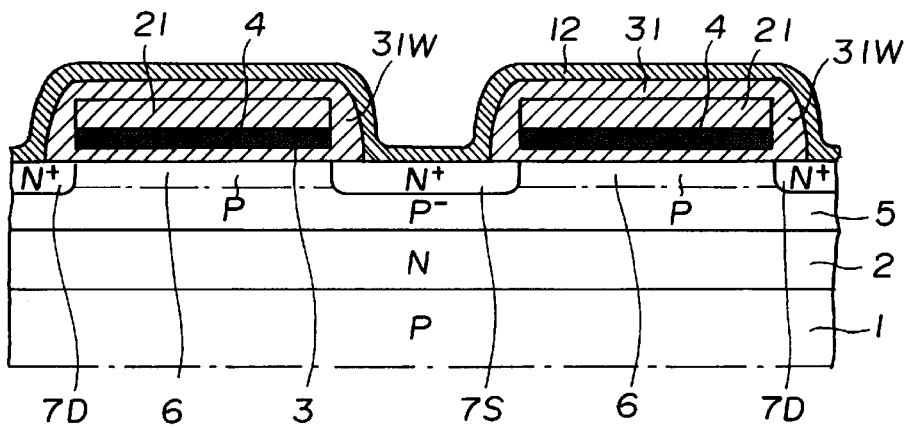
FIG. 10B shows a state in which a refractory metal film is formed as a light-shielding film on the entire surface.
Figure 10C:
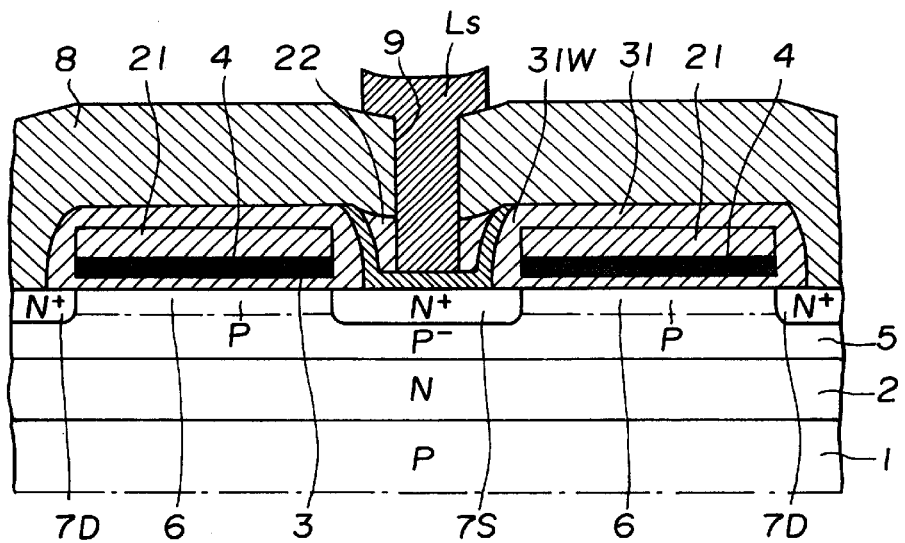

Then, a refractory metal film 12 composed of tungsten (W), molybdenum (Mo) or titanium (Ti) with a thickness of approximately tens of nm is formed on the entire surface by the CVD method or the sputtering method, as shown in FIG. 10B. The process of FIG. 7A and the subsequent processes are carried out. Finally, the amplification solid-state image device having a structure in which the patterned refractory metal film 12 serves both as the light-shielding film and as the barrier metal layer, as shown in FIG. 10C.

In the manufacturing method of the first modification, since the refractory metal film 12 serves both as the light-shielding film and as the barrier metal layer, the process of forming the barrier metal 23 shown in FIG. 8B can be omitted. Thus, manufacturing processes can be simplified.

Figure 11A:
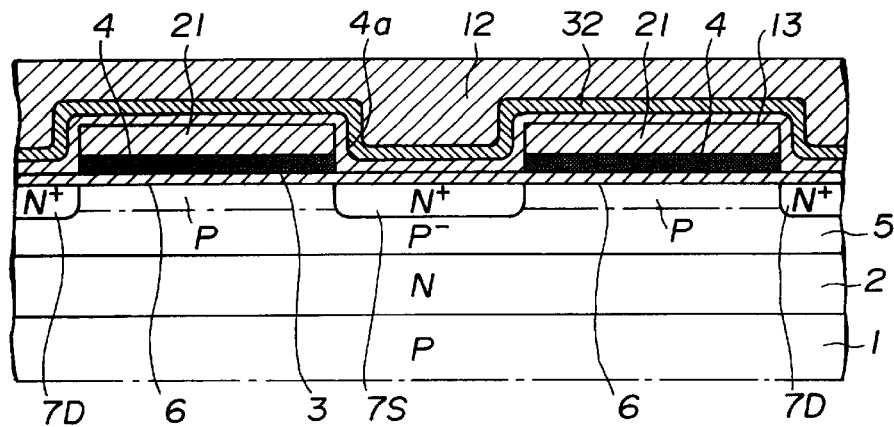
FIGS. 11A to 11C are views showing processes of a second modification of the method of manufacturing a solid-state image device of the embodiment.

In the second modification, a process of forming a blanket tungsten (W) replaces the processes shown in FIGS. 7A to 7C. That is, a tungsten (W) adhesion layer 32 composed of titanium tungsten (TiW) or titanium nitride (TiN) is formed by the sputtering method or the CVD method as shown in FIG. 11A, instead of the refractory metal film 12 formed in the process of FIG. 7A. Then, a tungsten layer 12 is formed on the adhesion layer 32.

Figure 11B:
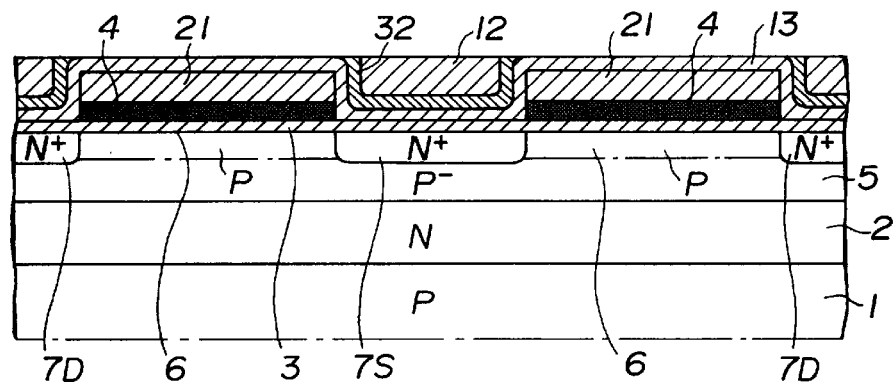
Figure 11C:
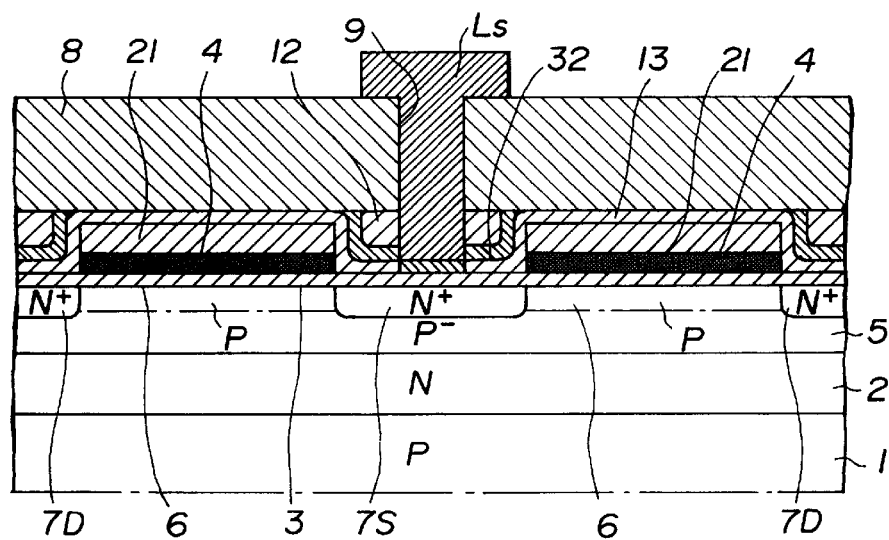

The entire surface of the tungsten layer 12 is etched back to be left on the source region 7S and the drain region 7D. Then, with the remaining tungsten layer 12 as a mask, the exposed adhesion layer 32 is removed by etching, as shown in FIG. 11B. The processes similar to those of FIGS. 8A and 8B are carried out, so that the amplification solid-state image device having the tungsten layer 12 formed by the blanket tungsten (W) method as the light-shielding film is produced as shown in FIG. 11C.

In the second modification, the light-shielding film can be formed simultaneously with filling of the tungsten layer 12 into contact holes in forming peripheral circuits. Thus, manufacturing processes can be simplified.

Figure 12A:
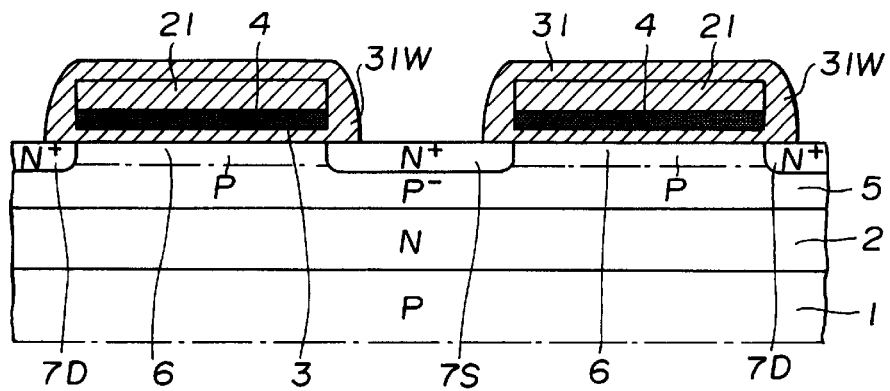
FIGS. 12A to 12C are views showing processes of a third modification of the method of manufacturing a solid-state image device of the embodiment.

In the third modification, as in the method of the first modification, a relatively thick oxide film 31 composed of $SiO_2$ is formed on the entire surface of the substrate by the CVD method, and is etched back to form a sidewall 31w composed of the oxide film 31 on the stacked film composed of the gate electrode 4 and the upper oxide film 21, as shown in FIG. 12A. In this case, the etching back is carried out until the silicon surface in the source region 7S and the drain region 7D is exposed.

Figure 12B:
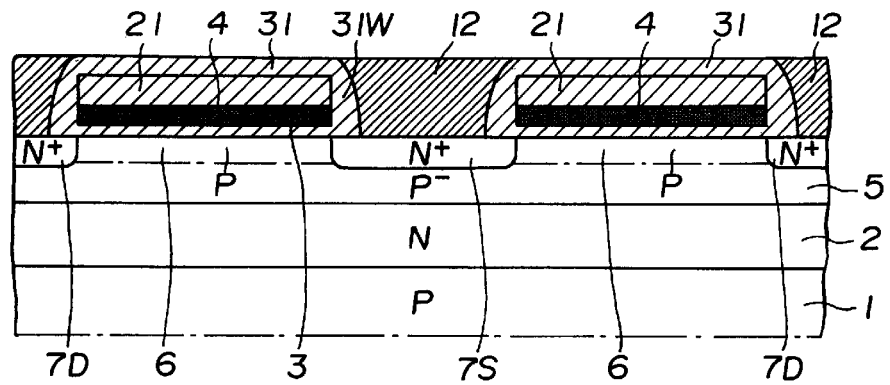
Figure 12C:
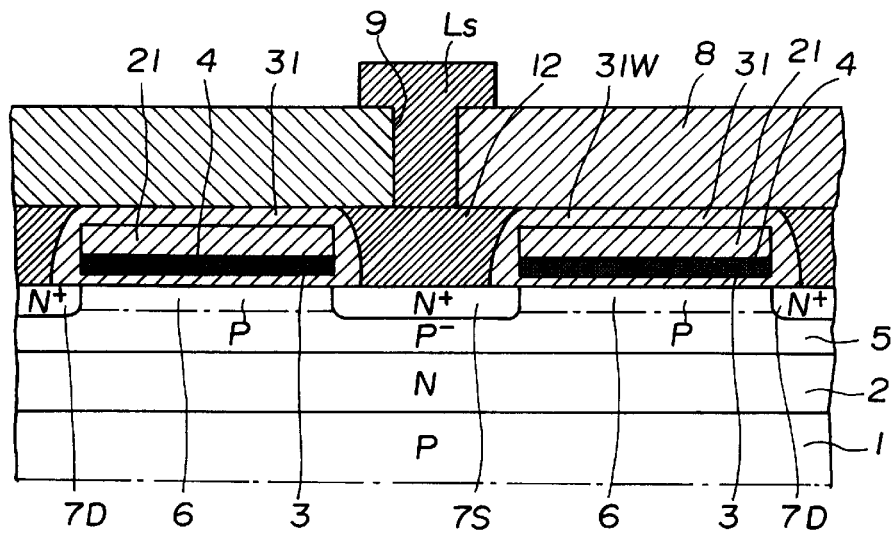

Then, selective growth CVD of tungsten (W) is carried out to form a tungsten layer 12 on the source region 7S and the drain region 7D exposing the silicon surface, as shown in FIG. 12B. The processes similar to those of FIGS. 8A and 8B are carried out, so that the amplification solid-state image device having the tungsten layer 12 formed by the selective growth CVD method as the light-shielding film can be produced, as shown in FIG. 12C.

In the manufacturing method of the third modification, since the tungsten layer 12 formed by the selective growth CVD method serves both as the light-shielding film and as the barrier metal layer, as in the first modification, the process of forming the barrier metal can be omitted. Thus, manufacturing processes can be simplified.

The methods of manufacturing the solid-state image device according to the above-described embodiment and the first to third modifications have an advantage of self-aligned formation of the light-shielding film, thus achieving the fine structure.

Figure 13A:
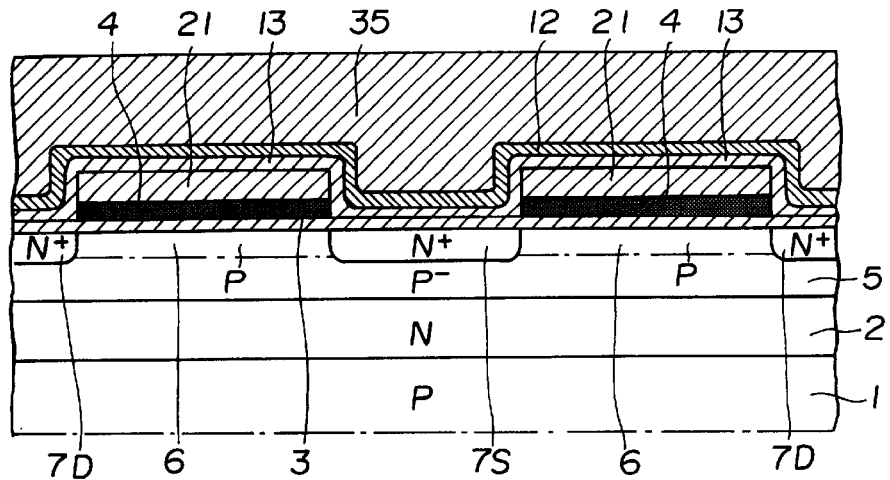
FIGS. 13A to 13C are views showing processes of a fourth modification of the method of manufacturing a solid-state image device of the embodiment.

In the fourth modification, after the process of FIG. 6C and the subsequent processes, a thin oxide film 13 is formed on the entire surface of the substrate, and a refractory metal film 12 is formed on the oxide film 13. A photoresist film 35, instead of the oxide film 22 shown in the process of FIG. 7A, is formed on the refractory metal film 12, as shown in FIG. 13A.

Figure 13B:
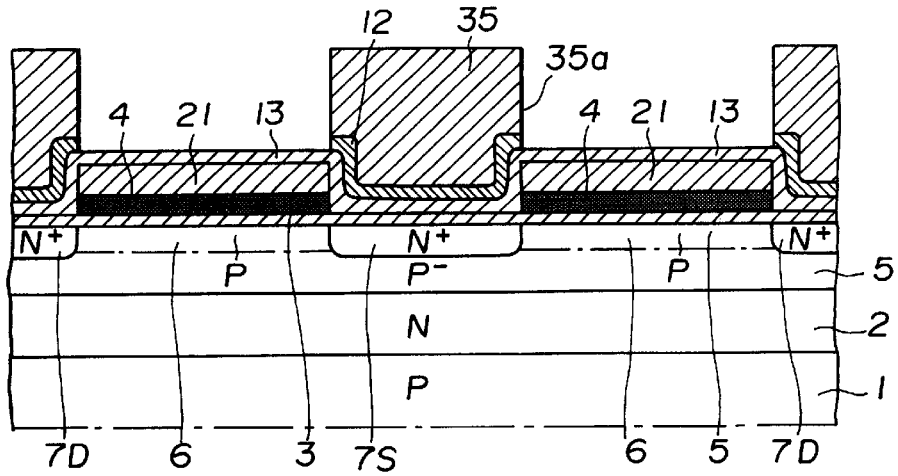
Figure 13C:
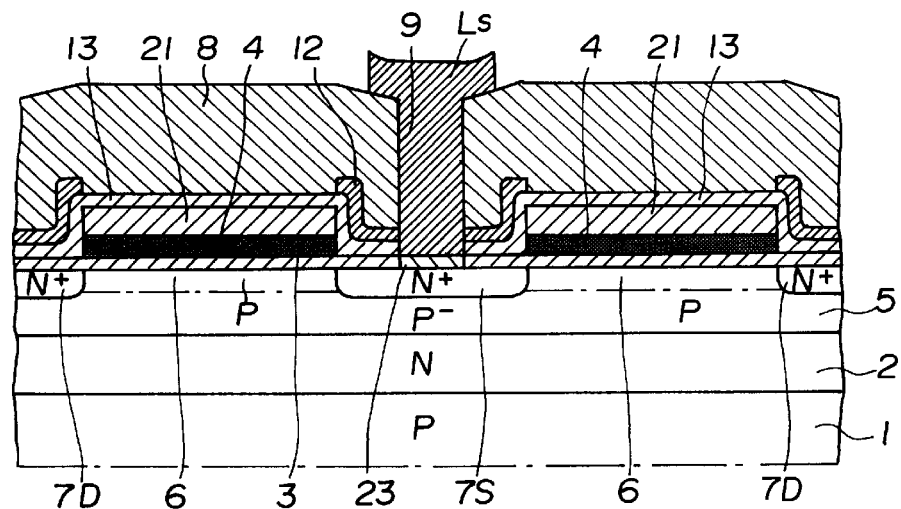

Then, an opening 35a is formed in a portion corresponding to the gate electrode 4 of the photoresist film 35, and the refractory metal film 12 exposed from the opening 35a is removed by etching, as shown in FIG. 13B. The processes of FIGS. 8A and 8B are carried out, so that the amplification solid-state image device having the light-shielding film composed of the refractory metal film 12 formed on the source region 7S and the drain region 7D can be produced, as shown in FIG. 13C. In this case, since the light is prevented from being incident on the drain region 7D by the light-shielding film 12, the effect of the light incident on the non-selected transistor Tr can be reduced further.

What is claimed is:

1. A solid-state image device comprising:
   a plurality of pixels, each pixel having a transistor for converting incident light into an electrical signal, the transistor comprising a semiconductor substrate, a source region and drain region formed on a surface of the semiconductor substrate, the source region and the drain region being spaced apart from each other to define a channel region therebetween, and a gate electrode formed above the channel region;
   a selection line electrically connected to the gate electrode for selecting a pixel from the plurality of pixels;
   an interlayer insulating film formed to cover the gate electrode and the source region and drain region;
   a signal line connected to one of the source region or the drain region through a contact hole formed in the interlayer insulating film; and
   a light-shielding film formed below the interlayer insulating film to exclusively cover only the source region or the drain region without connecting the gate electrode.

2. The solid-state image device as claimed in claim 1, wherein the light-shielding film is comprised of a refractory metal.

3. The solid-state image device as claimed in claim 1, wherein the gate electrode is formed in an annular shape.

4. The solid-state image device as claimed in claim 1, wherein the plurality of pixels are formed in a matrix.

5. A solid state imaging device comprising:
   a plurality of transistors for converting light into an electrical signal;
   the transistors comprising a source region and a drain region formed on a semiconductor substrate, the source region and the drain region being spaced apart to define a channel region;
   a gate electrode formed above the channel region;
   a thin insulating layer formed above the gate electrode and the source and drain regions;
   a light-shielding film formed on the thin insulating layer in a location which is not over the gate electrode; and
   an interlayer insulating film formed over the light-shielding film and the thin insulating layer.

6. The solid state imaging device of claim 5, wherein the gate electrode is circular with a hole in its center.

7. The solid state imaging device of claim 5, wherein a distance from a bottom surface of the light-shielding film to the source region is less than 100 μm.

8. The solid state imaging device of claim 5, further comprising a signal line which passes through the light-shielding film.

9. A solid state imaging device comprising:
   a plurality of transistors for converting light into an electrical signal;
   the transistors comprising a source region and a drain region formed on a semiconductor substrate, the source region and the drain region being spaced apart to define a channel region;
   a gate electrode formed above the channel region;
   light-shielding film formed above either the source region or drain region in a location which is not over the gate electrode; and
   an interlayer insulating film formed above over the light-shielding film.

10. The solid state imaging device of claim 9, wherein the gate electrode is circular with a hole in its center.

11. The solid state imaging device of claim 9, wherein a distance from a bottom surface of the light-shielding film to the source region is less than 100 μm.

12. The solid state imaging device of claim 9, further comprising a signal line which passes through the light-shielding film.

* * * * *